United States Patent
Shipley et al.

(10) Patent No.: US 7,209,364 B2
(45) Date of Patent: Apr. 24, 2007

(54) CIRCUIT BOARD LATCH SYSTEM

(75) Inventors: James C. Shipley, Gilbert, AZ (US); Javier Leija, Chandler, AZ (US); Christopher A. Gonzales, Chandler, AZ (US); Christopher D. Lucero, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 52 days.

(21) Appl. No.: 11/024,625

(22) Filed: Dec. 29, 2004

(65) Prior Publication Data

US 2006/0139897 A1 Jun. 29, 2006

(51) Int. Cl.
*H05K 7/14* (2006.01)

(52) U.S. Cl. ............... 361/801; 361/759; 361/747; 361/740; 361/732; 361/726

(58) Field of Classification Search ............ 361/726, 361/732, 747, 759, 801, 727, 740; 312/216, 312/223.2, 223.3
See application file for complete search history.

(56) References Cited

U.S. PATENT DOCUMENTS

| 1,334,314 | A | | 3/1920 | Parsons |
|---|---|---|---|---|
| 4,644,444 | A | * | 2/1987 | Rush ............... 361/708 |
| 6,049,451 | A | * | 4/2000 | Schmitt et al. ......... 361/685 |
| 6,209,367 | B1 | * | 4/2001 | Hyatt et al. ............ 70/278.2 |
| 6,252,514 | B1 | * | 6/2001 | Nolan et al. ........... 340/686.4 |
| 6,301,123 | B1 | * | 10/2001 | Nealis et al. ........... 361/798 |
| 6,498,730 | B2 | * | 12/2002 | Centola et al. ........... 361/759 |
| 6,588,243 | B1 | * | 7/2003 | Hyatt et al. ............ 70/278.2 |
| 6,667,889 | B2 | * | 12/2003 | Jansen ............... 361/752 |
| 6,674,651 | B2 | * | 1/2004 | Momiyama et al. ....... 361/796 |
| 6,970,361 | B2 | * | 11/2005 | Jansen ............... 361/759 |
| 6,975,519 | B2 | * | 12/2005 | Siahpolo et al. ......... 361/798 |
| 7,027,309 | B2 | * | 4/2006 | Franz et al. ........... 361/798 |

FOREIGN PATENT DOCUMENTS

| DE | 916652 | 8/1954 |
|---|---|---|
| DE | 941067 | 4/1956 |
| JP | 11-087950 | 3/1999 |
| WO | 9318517 | 9/1993 |
| WO | 2006072100 A2 | 7/2006 |

OTHER PUBLICATIONS

International Search Report and Written Opinion of the International Searching Authority; Dated Jul. 19, 2006; PCT/US2005/047680, 13 pgs.
"Advanced TCA. PICMG 3.0 Short Form Specification", PCI Industrial Computers Manufacturers Group (PICMG), GTPP Standard # 18b, (Jan. 2003), 33 pages.

* cited by examiner

*Primary Examiner*—Tuan Dinh
*Assistant Examiner*—Dameon E. Levi
(74) *Attorney, Agent, or Firm*—Grossman, Tucker, Perreault & Pfleger, PLLC (57) ABSTRACT

A method according to one embodiment may include providing a circuit board assembly comprising a circuit board and a rotatable knob and at least one latch coupled to the knob via a linkage. The method of this embodiment may also include moving the at least one latch to a retracted position by rotating the knob, and inserting the circuit board assembly into a chassis. The method may then include moving the latch to an extended position. Of course, many alternatives, variations, and modification are possible without departing from this embodiment.

19 Claims, 7 Drawing Sheets

CIRCUIT BOARD LATCH SYSTEM

FIELD

The present invention relates to systems for latching systems for retaining circuit boards in a chassis, housing, or frame.

BACKGROUND

Many computer and electronics systems include removable and/or replaceable circuit boards. Such removable circuit boards may, for example, be in the form of computer blades, cards, etc. The circuit boards are often assembled in a chassis and couple to backplanes or other circuit boards or components. Electrical coupling of the circuit board may allow circuitry on the circuit board to interact with other circuitry and/or systems. The electrical coupling necessary for such interaction usually has a mechanical aspect that is necessary to achieve and maintain proper electrical coupling between the circuit board. Additionally, the mechanical coupling of the circuit board may also protect the circuit board and/or make the circuit board less susceptible to damage. The circuit board may be electrically and/or mechanically coupled to another circuit board or component and may also be mechanically coupled to another component, such as to the chassis of the computer system or electronics equipment.

According to a common system for coupling a blade or circuit board to a chassis, a typical advanced telecommunications architecture (ATCA) blade computer uses a latch mechanism for retaining or coupling the blade in the chassis. The latching system includes two flip latches, with one being located at either end of the blade faceplate. The flip latches generally include small handles on a pivot. When the handles are pivoted to a position parallel to the faceplate of the blade, the latches may be in an engaged condition. The flip latches may be moved to a disengaged condition by pivoting the handles to a position generally perpendicular to the faceplate of the blade. This system requires the user to use both hands when installing the ATCA blade to the chassis. Additionally, while the ends of the handles may be angled outwardly, when the latch system is in an engaged condition with the handles laying parallel to the faceplate, it may be difficult to grasp and manipulate the handles to release the blade or circuit board.

The problem of accessing and manipulating the handles between an engaged and disengaged condition, or vise-versa, is exacerbated in systems including small form factor blades or circuit boards in which the size of the blade or circuit board may make it awkward or difficult to manipulate the latches. Similar difficulty may arise in systems having closely spaced blades or circuit boards in which the adjacent blades or circuit boards may make it difficult to access the latch handles of an individual circuit board. These problems may be increased by a chassis having restricted or impeded access to the blades or circuit boards.

BRIEF DESCRIPTION OF THE DRAWINGS

Features and advantages of the claimed subject matter will be apparent from the following detailed description of embodiments consistent therewith, which description should be considered with reference to the accompanying drawings, in which:

Although the following detailed description will proceed with reference being made to particular illustrated embodiments, it should be understood that numerous variations and modifications will be apparent to those having skill in the art. Accordingly, the claimed subject matter should be interpreted broadly without limitation to the particular illustrated embodiments herein.

DETAILED DESCRIPTION

Figure 1:
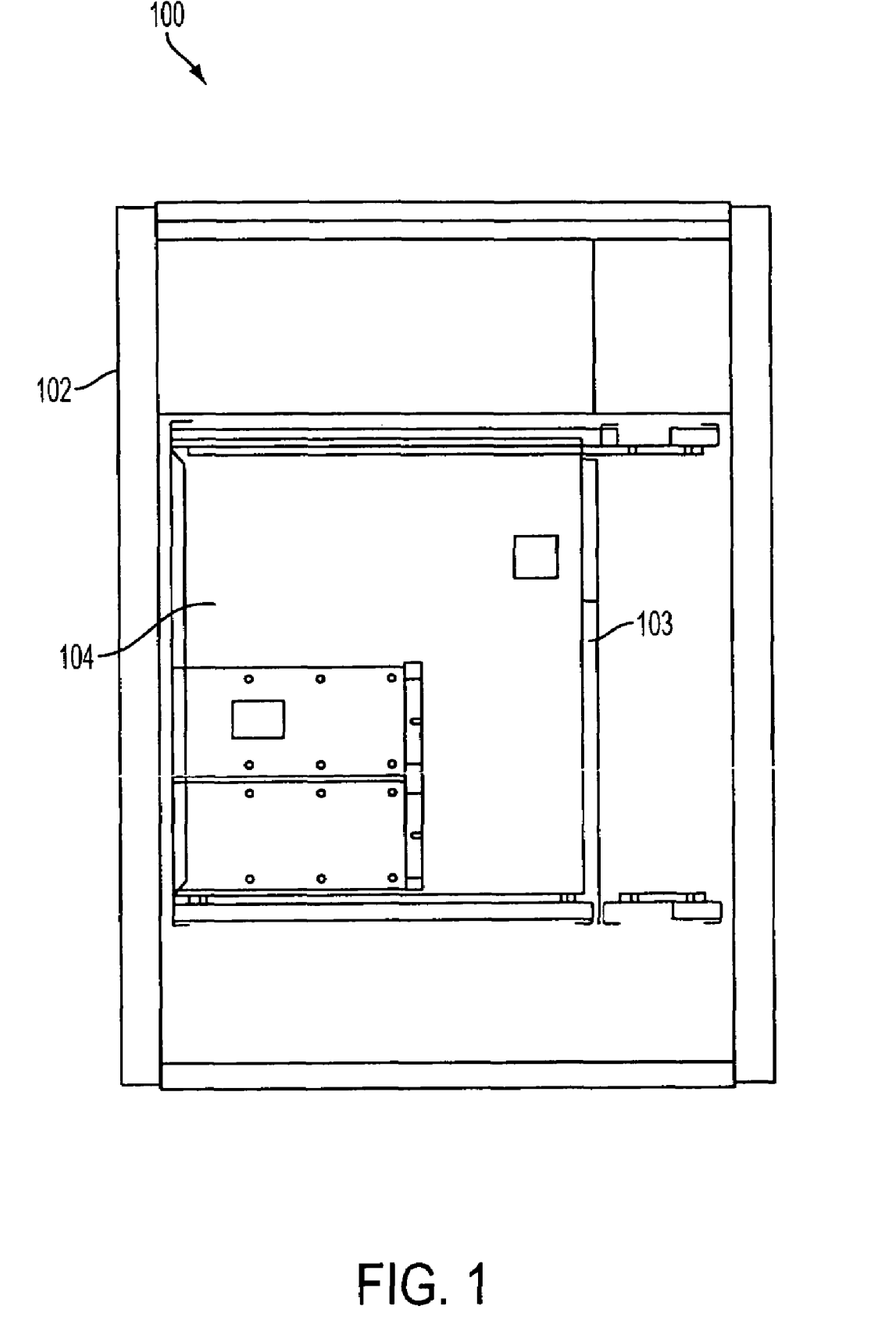
FIG. 1 is an embodiment of a system including a circuit board assembly utilizing a latching system consistent with the present disclosure.

With reference to FIG. 1, an embodiment of a computer system 100 is illustrated. The computer system 100 may generally include a chassis 102 having at least one circuit board assembly 104 disposed within the chassis 102. The circuit board assembly 104 may be removably disposed within the chassis 102, and may be capable of being electrically and/or mechanically coupled to the chassis 102 and/or one or more additional circuit boards, features, and/or components disposed at least partially within the chassis 102. In an embodiment, the circuit board assembly 104 may be capable of being electrically and/or mechanically coupled to a backplane 103 disposed within the chassis 102. According to one embodiment the chassis 102 may be an advanced telecommunications computing architecture (advanced TCA or ATCA) chassis, complying with, or compatible with, PCI Industrial Computer Manufacturers Group (PICMG), Advanced Telecommunications Computing Architecture (ATCA), PICMG 3.0 Rev. 1.0, published Dec. 30, 2002. According to such an embodiment, the circuit board assembly 104 disposed within the chassis 102 may be an ATCA board, also referred to as an ATCA blade. According to various other embodiments consistent with the present disclosure, the system may be any electronics system including at least one circuit board assembly that is capable of being at least partially removed or uncoupled from the chassis.

Figure 2:
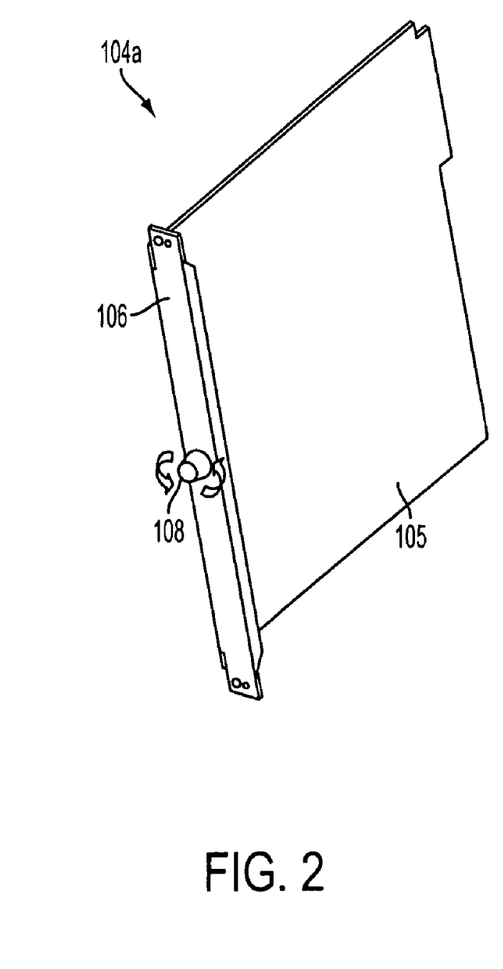
FIG. 2 is a perspective view of a circuit board assembly depicting the front of a circuit board faceplate including an embodiment of a latching system consistent with the present disclosure.
Figure 3:
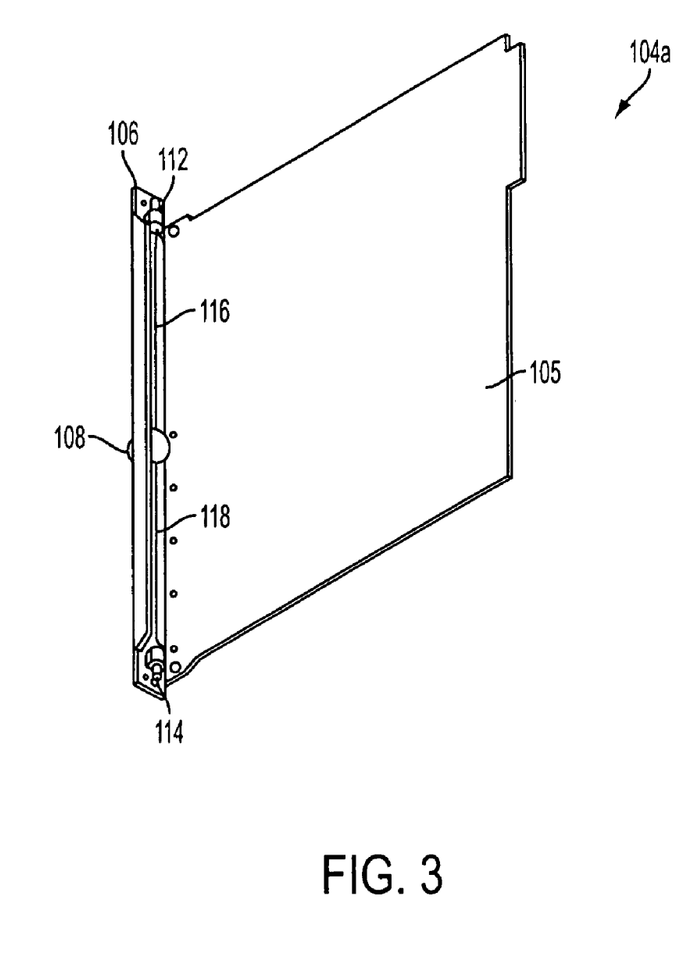
FIG. 3 is a perspective view of a circuit board assembly depicting the rear of a circuit board faceplate including an embodiment of a latching system consistent with the present disclosure.
Figure 4:
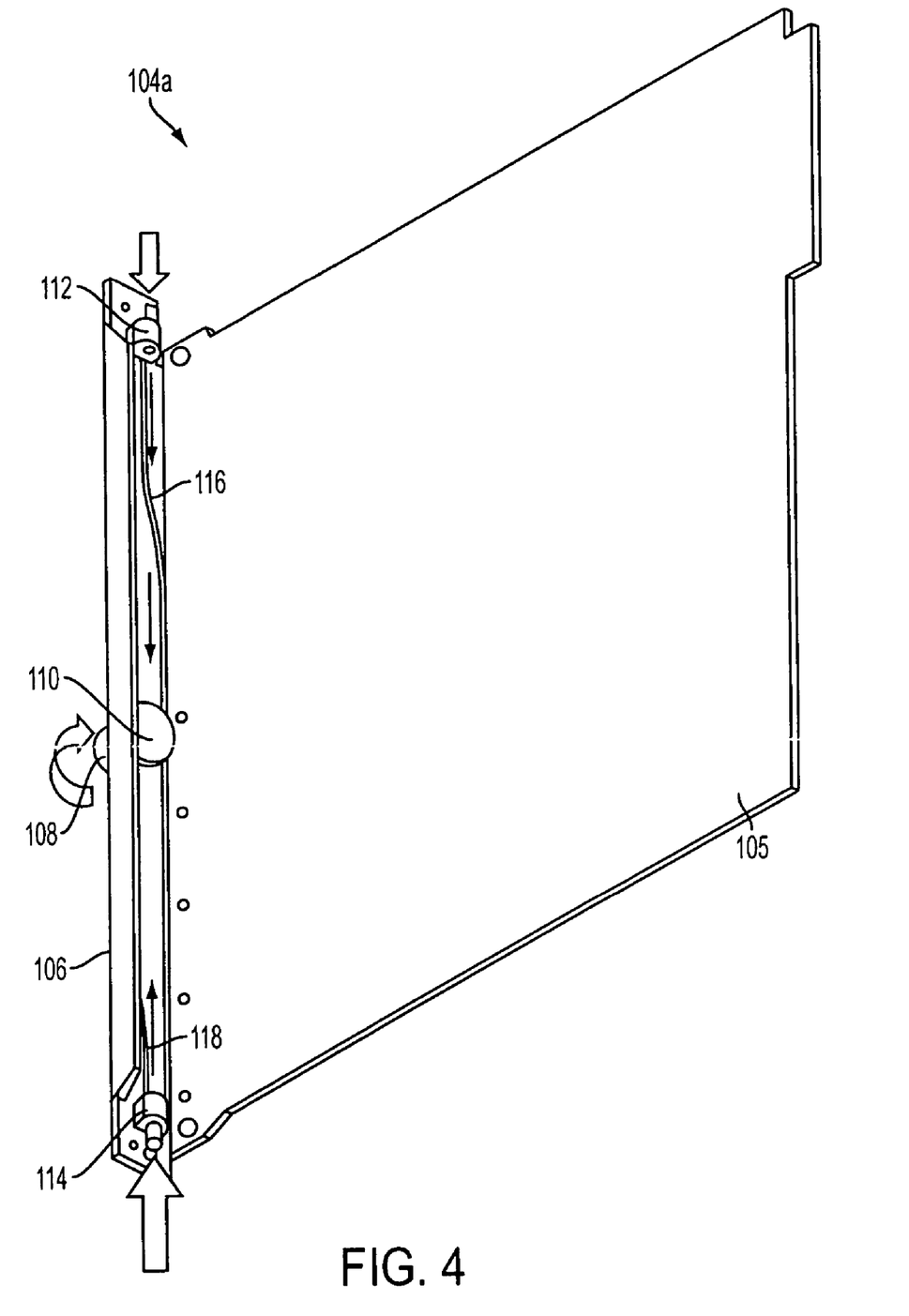
FIG. 4 is a detailed perspective view of a circuit board assembly showing the rear of the circuit board face plate including an embodiment of a latching system consistent with the present disclosure.

Referring to FIGS. 2 through 4 an embodiment of the circuit board assembly 104a is shown. As depicted, the circuit board assembly 104a may include a faceplate 106 extending along at least a portion of one edge of a circuit board 105. Consistent with any embodiment herein, the circuit board 105 and the faceplate 106 may both be provided as separate components that may be assembled, attached, and/or coupled to one another, either directly or indirectly. Alternatively, the circuit board 105 and the faceplate 106 may be provided as a single component of unitary construction. In one embodiment, the faceplate 106 may be oriented generally perpendicular to the circuit board 105. One side of the faceplate 106 may generally face away or outwardly relative to the circuit board 105, and another side of the faceplate 106 may generally face inwardly relative to the circuit board 105. The faceplate 106 may include a latching system capable of releasably coupling the circuit board 104a to the chassis 102 and/or to a feature of the chassis 102 and/or a component disposed at least partially within the chassis 102. A knob 108 may be provided on the faceplate 106. According to an embodiment herein, the knob 108 may be provided generally in the center of the faceplate 106 and facing outwardly relative to the circuit board 105. A linkage actuator 110 may be directly or indirectly coupled to the knob 108 to allow rotational motion to be transmitted from the knob 108 to the linkage actuator 110. According to an embodiment herein, the knob 108 may be coupled to the linkage actuator 110 by a shaft extending through the faceplate 106.

At least one latch assembly 112, 114 may be disposed on the faceplate 106. In one embodiment, two latch assemblies 112, 114 may be provided with one disposed adjacent to each end of the faceplate 106. The latch assemblies 112, 114 may be directly or indirectly coupled to the faceplate 106. As shown, the latch assemblies 112, 114 may be disposed on a side of the faceplate 106 facing inwardly relative to the circuit board 105. As such, the latch assemblies 112, 114 may be disposed on the same side of the faceplate 106 as the linkage actuator 110. Alternatively, the latching mechanisms 112, 114 may be disposed on the same side of the faceplate 106 as the knob 108.

Each of the latch assemblies 112, 114 may be coupled to the linkage actuator 110 by a linkage 116, 118 extending therebetween. The linkages 116, 118 may be rigid and/or flexible members and/or may include rigid and flexible regions. In one embodiment, the linkages 116, 118 may be generally flexible cables or wires. According to another embodiment, the linkages 116, 118 may be generally rigid pushrod-type members. Consistent with the latter embodiment, pushrod-type linkages may be generally straight and/or may be contoured, e.g., including one or more bends, arcs, etc. As one aspect, contoured pushrod linkages may be provided to conform around features on and/or adjacent to the faceplate 106 in the region linkages 116, 118. As another aspect, contoured pushrod-type linkages may be employed to accommodate performance and/or operational considerations.

As mentioned previously, rotation of the knob 108 may cause rotation of the linkage actuator 110 on the opposite side of the faceplate 106. The linkages 116, 118 may be coupled to the linkage actuator 110 in a manner such that rotation of the linkage actuator 110 may be capable of translating the linkages 116, 118 relative to longitudinal expanse of the faceplate 106. Therefore, the linkages 116, 118 may be translated relative to the faceplate 106. In the illustrated embodiment, the linkage actuator 110 has a generally circular shape and the linkages 116, 118 are generally coupled at the periphery of the linkage actuator 110. Rotation of the linkage actuator 110 may move at least a portion of the linkages 116, 118, e.g., an end portion of the linkages 116, 118, about an arcuate path around the axis of rotation of the linkage actuator 110.

According to various other embodiments, the linkage actuator may have numerous other configurations, designs, and/or arrangements. For example, the linkage actuator may be formed as a toggle, or longitudinal member, extending radially across the axis of rotation of the knob. The linkages may be coupled to the longitudinal member. The linkages may, accordingly, be moved through an arcuate path upon rotation of the knob, in the same manner as the illustrated circular geometry linkage actuator 110. In one embodiment employing a flexible linkage, the linkage actuator may operate generally in the manner of spool. The flexible linkage may be attached to an edge of the linkage actuator. When the linkage actuator is rotated, the flexible linkage may wrap around at least a portion of the circumference of the linkage actuator. Such an embodiment may be susceptible to use with both round and non-round linkage actuators. In yet another embodiment, the linkage actuator may have an eccentric arcuate profile. The linkages may include rigid members that may bear against the edge of the eccentric arcuate profile, and may move corresponding to the relative movement of the arcuate profile to the axis of rotation.

Figure 5:
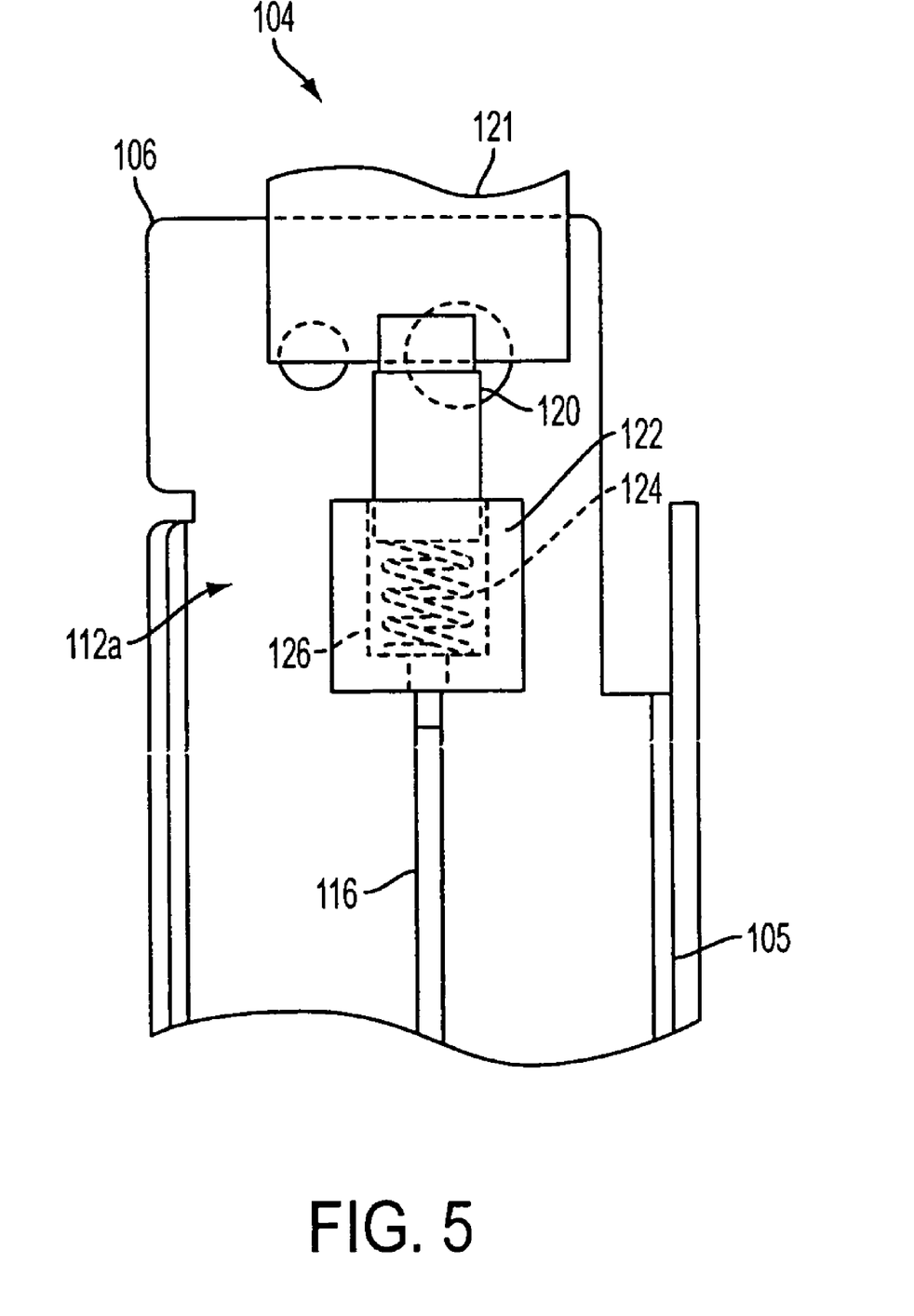
FIG. 5 is a detailed view of an embodiment of a latch assembly of a latching system consistent with the present disclosure in an extended position.
Figure 6:
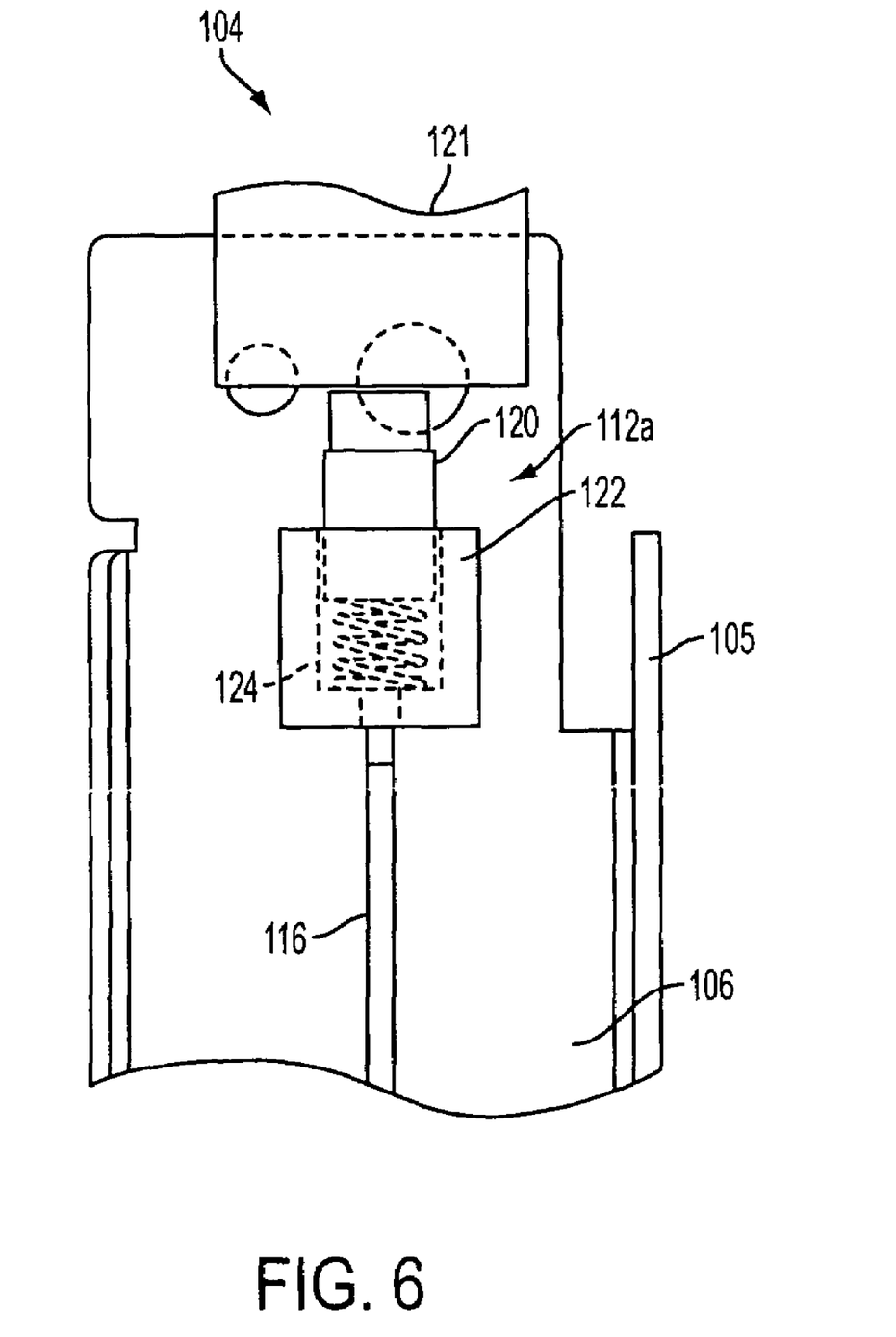
FIG. 6 is a detailed view of an embodiment of a latch assembly of a latching system consistent with the present disclosure in a retracted position.

Turning to FIGS. 5 and 6, a detailed view of an embodiment of a latch assembly 112a is illustrated in a latched, or extended, position and an unlatched, or retracted, position respectively. The latch assembly 112a may generally include a latch 120, a retainer 122, and a spring 124. The latch 120 may be movable relative to the retainer 122. As depicted, the retainer 122 may include an opening 126, and the latch 120 may be at least partially slidably disposed within the opening 126 of the retainer 122. Movement of the latch 120 may be guided and/or controlled by the retainer 122. The spring 124 may also be disposed in the opening 126 in the retainer 122 and may bias the latch 120 toward an extended, or latched, position as shown in FIG. 5.

The linkage 116 may extend into the retainer 122 and may be coupled to the latch 120 inside of the retainer 122. Alternatively, a portion of the latch 120 may extend from the rear or the side of the retainer 122. For example, the latch may include a tail which may extend from the rear of the retainer, and the linkage 116 may be coupled to the tail. Other configurations are also contemplated herein. Consistent with any of the embodiments contemplated by the foregoing, the latch 120 may be moved between an extended, or latched, position and a retracted position, as shown in FIG. 6, by translating the linkage 116, e.g., as a result of rotating the knob 108 and linkage actuator 110. As used in any embodiment herein, the terms retracted position and extended position indicate a position of the latch 120 relative to a cooperating feature 121 of a chassis and/or associated with a chassis or a component therein, etc. Accordingly, retracted position and extended position should not be construed as requiring that the latch 120 be at positions of maximum retraction and/or maximum extension.

Consistent with the preceding description of the illustrated circuit board assembly 104a and latch assembly 112a, the spring 124 may bias the latch 120 toward an extended, or latched, position. The biasing force of the spring 124 may pull the linkage 116 toward the latch assembly 112a, and thereby cause the linkage actuator 110 and knob 108 to rotate to a position permitting the greatest extension of the linkage 116. The latch 120 may be moved to a retracted position by rotating the knob 108, and thereby the linkage actuator 110, to pull or retract the linkage 116. The linkage 116 may in turn urge the latch 120 against the biasing influence of the spring 124, thereby compressing the spring 124 and moving the latch 120 to a retracted position as illustrated in FIG. 6. With the latch 120 in a retracted position the circuit board assembly 104a may be installed into, or removed from, the chassis 102. After the circuit board assembly 104a has been installed or removed, the latch 120 may be returned to the extended position. In an embodiment herein, the latch 120 may be returned to an extended position by releasing the torque on the knob 108. The biasing force of the spring 124 may drive the latch 120 to an extended position. The biasing force of the spring 124 may also drive the linkage 116, linkage actuator 110, and thereby the knob 108, to an extended position.

According to an alternative embodiment, the springs may be omitted from the latching assembly. In one such embodiment, the linkage may be a pushrod type linkage and may be capable of exerting both a pushing and a pulling force on the latch. Rotation of the knob in a first direction may apply a pulling force on the latch, and thereby move the latch from an extended position toward a retracted position. As with the preceding description, when the latch is in the retracted position the circuit board assembly may be installed into, or removed from, a chassis. Once the circuit board assembly has been installed into a chassis, the knob may be rotated in the opposite direction, applying a pushing force on the latch and moving the latch from a retracted position toward an extended position. When the latch is in an extended position, the circuit board assembly may be coupled in the chassis. According to a variation on the preceding embodiment, the knob and/or the latch assembly may include one or more detents capable of releasably retaining the latch in an extended position. The latch may be releasably retained in an extended position by resisting rotational movement of the knob and/or by resisting translational movement of at least one of the linkage and the latch.

According to another variation, a single spring may be used to drive and/or bias both of the latch assemblies toward an extended position. In one such embodiment, the linkage may be a pushrod-type linkage such that both a pushing and a pulling force exerted on one linkage will be transmitted through the linkage actuator to the other linkage. Accordingly, a spring associated with one latch assembly and/or with one linkage may apply a biasing force on the linkage or latch toward an extended position. The biasing force on the one latch or linkage may be transmitted through the linkage actuator to the other linkage. The biasing force transmitted to the other linkage may provide a biasing force on the other latch toward an extended position. According to another embodiment employing a single spring, a torsion spring or a clock spring may be associated with knob and/or linkage actuator. The torsion spring or clock spring may bias the knob and the linkage actuator in a first rotational direction. The first rotational direction of the knob and the linkage actuator may be associated with an extended position of the latch. Accordingly, the biasing force on the knob and the linkage actuator may transmit a force through the linkage, and may bias each of the latches toward an extended position. The latches may be moved to a retracted position by rotating the knob and the linkage actuator against the biasing force of the spring to apply a retracting force on the latches via the linkages.

Figure 7:
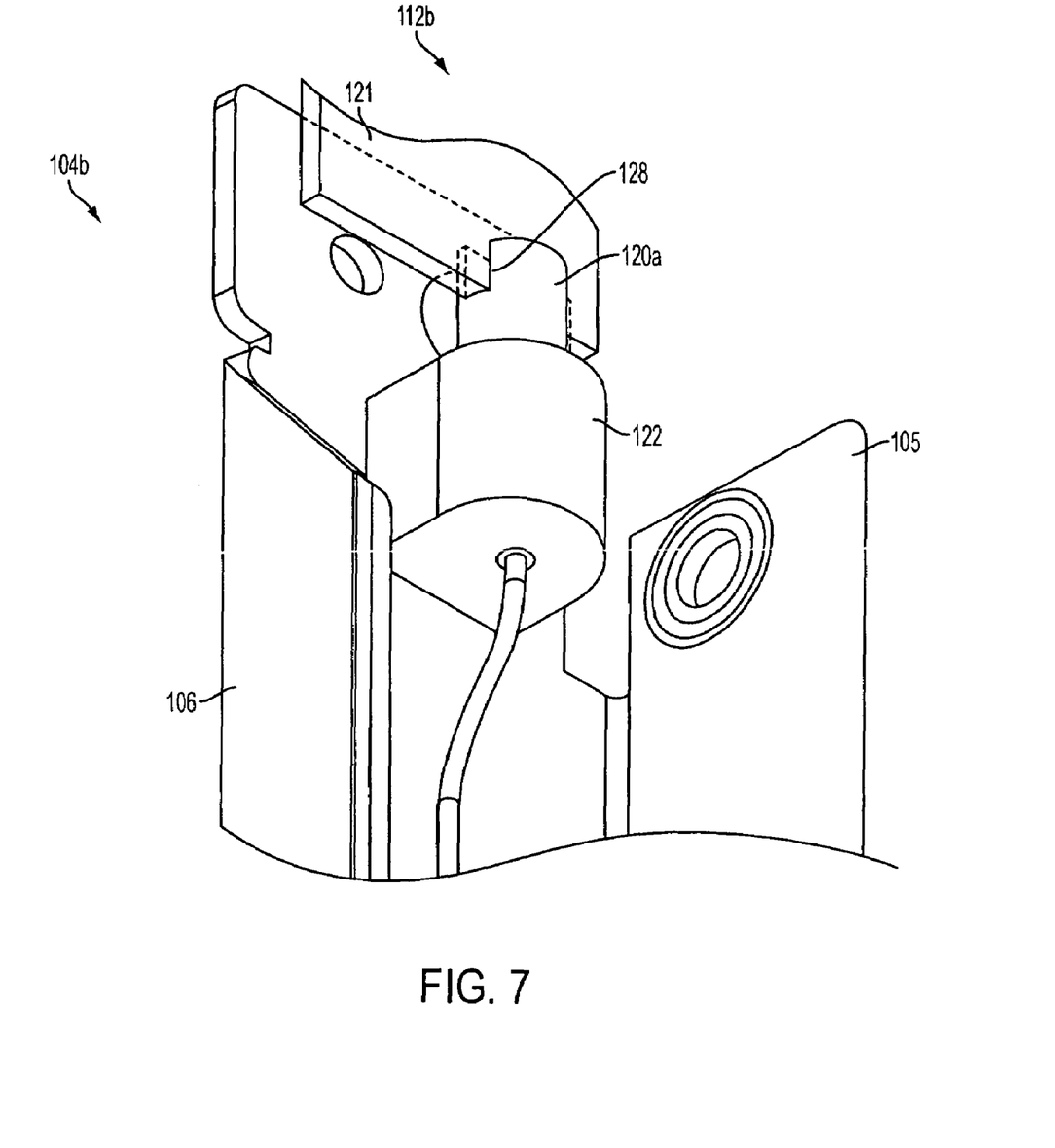
FIG. 7 is a detailed view of an embodiment of a latch assembly of a latching system consistent with the present disclosure.

Referring to FIG. 7, a detailed view of an embodiment of a latch assembly 112b consistent with the present disclosure is shown. Consistent with the illustrated embodiment, the latch 120a may have a cut-out or notch 128 in the end thereof. The notch 128 may be capable of engaging a cooperating feature 121 of the chassis and/or associated with chassis or a component therein. For example, the chassis may include a rail or rib that may be sized to be at least partially received in the notch 128 of the latch 120a. Engagement between the notch 128 in the latch 120a and the cooperating feature 121 of the chassis may retain the circuit board assembly 104b in proper engagement in the chassis.

In an alternative embodiment, the latch may include a tapered lead in. That is, the latch may have an angled surface in the direction of insertion of the circuit board assembly into the chassis. When the circuit board assembly is installed into the chassis the angled surface of the latch may encounter a cooperating feature of the chassis, such as a locking rail, rib, etc. Contact between the angled face of the latch and the cooperating feature of the chassis may push the latch toward a retracted position and allow the latch to be inserted past the cooperating feature of the chassis. Once the latch has moved past the cooperating feature of the chassis, the latch may be urged toward an extended position by the spring biasing the latch toward the extended position. Such an embodiment of a circuit board assembly may be installed in a chassis simply by properly orienting the circuit board assembly relative to the chassis and then pushing the circuit board assembly into position. To remove the circuit board assembly from the chassis, the knob may be rotated to move the latches toward a retracted position, as discussed previously. With the latches in a retracted position the circuit board assembly may be extracted from the chassis.

It should be appreciated that while the forgoing description and associated figures have described one latch assembly 112a or 112b located at a first end of the faceplate 106, a second latch assembly 114 disposed at the longitudinally opposed end of the faceplate 106 may have a similar and/or the same configuration. Alternatively, however, the second latch feature 114 may have a different configuration than a first latch feature.

Figure 8:
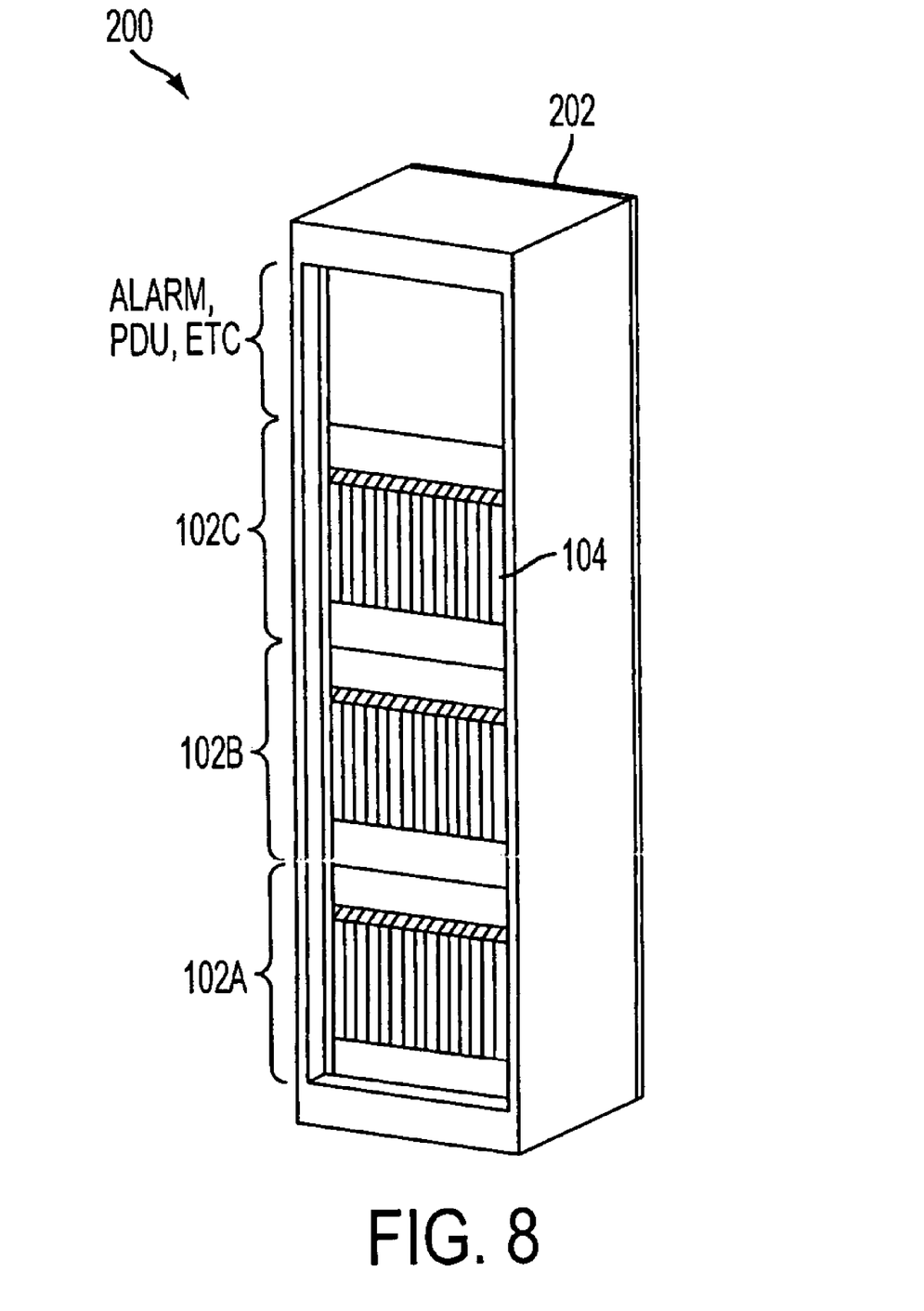
FIG. 8 is a schematic illustration of a frame that may suitably be used in connection with the present disclosure.

Referring to FIG. 8, a system 200 consistent with the present disclosure is illustrated. As depicted, the system 200 may include a frame 202. The frame 202 may accommodate and electrically couple a plurality of chassis 102A, 102B, and 102C. One or more of the chassis 102A, 102B, 102C may include a circuit board assembly 104 consistent with any embodiment described herein. The frame 202 may include, for example, a power supply for providing power to each of the individual chassis 102A, 102B, 102C disposed in the frame 202, etc. Additionally, as mentioned above, the frame may electrically couple one or more of the chassis 102A, 102B, 102C to at least one other chassis.

According to an alternative embodiment, rather than being disposed in a common frame, a system consistent with the present disclosure may include a plurality of chassis that may be individually hardwired to one another. One or more of the plurality of chassis may include at least one circuit board assembly consistent with any embodiment described herein. Additionally, each of the plurality of chassis may be powered by an individual power supply and/or may be separately powered by a common power supply. Such a system may, therefore, provide a greater freedom in the physical arrangement and interrelation of the plurality of chassis.

Consistent with various embodiments of the present disclosure, a circuit board assembly may provide facile assembly with a chassis, or another circuit board, or a cooperating component, etc. In some embodiments herein, installation and/or removal of the circuit board assembly may be possible with one handed operation. A useful application may be in the context of circuit boards that are assembled to a chassis, other circuit board, or component in a confined space. For example, a single-board computer system such as advanced telecommunications architecture (ATCA) form factor, or any other small form factor computer systems or electronics systems, may employ a circuit board assembly consistent with the present disclosure. Application of the present disclosure should, therefore, not be construed as being limited to any particular computer system, electronics system, or form factor.

Operation of a latching system according to an embodiment herein may include rotation of knob located generally centrally on a faceplate of a circuit board assembly. Locating the knob centrally on the faceplate may facilitate access to, and/or operation of, the knob. However, the knob may be located at other positions on the faceplate, and/or may be located on features of the circuit board assembly other than the faceplate. Rotation of the knob may move one or more latches between an extended position and a retracted position, thereby allowing installation and/or removal of the circuit board assembly from a chassis, another circuit board, a components, etc. According to an embodiment, rotation of a single knob may actuate or move a plurality of latches. One or more latches may be, but are not necessarily, biased towards one of an extended position and a retracted position.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A system comprising:
    a frame comprising at least one chassis;
    at least one circuit board assembly configured to be coupled to said chassis;
    a faceplate integrally coupled to said circuit board assembly, said faceplate comprising at least one latch moveable between an extended position configured to engage said chassis to lock said circuit board assembly and said faceplate to said chassis and a retracted position configured to disengage said chassis to permit removal of said circuit board assembly and said faceplate from said chassis; and
    a rotatable knob coupled to said at least one latch and configured to move said at least one latch between said extended and said retracted positions.

2. A system according to claim 1, wherein said knob and said at least one latch are disposed on said faceplate.

3. A system according to claim 1 wherein said at least one latch is coupled to said rotatable knob via a linkage.

4. A system according to claim 3, wherein said circuit board assembly further comprises a linkage actuator rotatable with said knob.

5. A system according to claim 1, further comprising a spring biasing said latch toward said extended position.

6. A system according to claim 1, wherein said circuit board assembly comprises an advanced telecommunications architecture circuit board.

7. A system according to claim 1, wherein said circuit board assembly comprises a first and at least a second different edge region, and wherein said faceplate is configured to be secured along at least a portion of only said first edge region of said circuit board.

8. A circuit board assembly for use with a chassis comprising:
    a circuit board;
    a faceplate integrally coupled to said circuit board, said faceplate comprising
    at least one latch assembly comprising at least one latch moveable between an extended position configured to engage said chassis to lock said circuit board assembly and said chassis and a retracted position configured to disengage said chassis to permit removal of said circuit board assembly and said faceplate from said chassis; and
    a rotatable knob coupled to said at least one latch assembly and configured to move said at least one latch between said extended and said retracted positions.

9. A circuit board assembly according to claim 8, further comprising a spring biasing said latch toward said extended position.

10. A circuit board assembly according to claim 9, wherein said spring is part of said latch assembly.

11. A circuit board assembly according to claim 8, further comprising a linkage, and wherein said at least one latch assembly is coupled to said rotatable knob via said linkage.

12. A circuit board assembly according to claim 11, wherein said linkage comprises a cable.

13. A circuit board assembly according to claim 11, further comprising a linkage actuator rotatable with said rotatable knob, and said linkage is coupled to said rotatable knob through said linkage actuator.

14. A circuit board assembly according to claim 8, wherein said latch comprises a notch configured to engage with cooperating feature of a chassis.

15. A circuit board assembly for use with a chassis comprising:
    a circuit board;
    a faceplate integrally coupled to said circuit board, said faceplate comprising a latch assembly movable between an extended position configured to engage said chassis to lock said circuit board assembly and said faceplate to said chassis and a retracted position configured to disengage said chassis to permit removal of said circuit board assembly and said faceplate from said chassis; and
    rotatable means coupled to said at least one assembly and configured to move said at least one latch between said extended and said retracted positions.

16. A circuit board assembly according to claim 15, wherein said circuit board comprises a first and at least a second different edge region, and wherein said faceplate is configured to be secured along at least a portion of only said first edge region of said circuit board.

17. A circuit board assembly according to claim 15, further comprising a spring biasing said latch toward said extended position.

18. A circuit board assembly according to claim 15, wherein said rotatable means further comprises a rotatable knob coupled to said latch assembly via linkage.

19. A circuit board assembly according to claim 18, further comprising a linkage actuator rotatable with said rotatable knob, and said linkage is coupled to said rotatable knob through said linkage actuator.

* * * * *